(12) United States Patent
Nieuwenhuizen

(10) Patent No.: US 10,317,573 B2
(45) Date of Patent: Jun. 11, 2019

(54) LOCATING A LIGHTNING STRIKE AT A WIND TURBINE

(71) Applicant: Siemens Aktiengesellschaft, München (DE)

(72) Inventor: John Nieuwenhuizen, Horsens (DK)

(73) Assignee: SIEMENS GAMESA RENEWABLE ENERGY A/S (DK)

( * ) Notice: Subject to any disclaimer, the term of this patent is extended or adjusted under 35 U.S.C. 154(b) by 0 days.

(21) Appl. No.: 15/450,054

(22) Filed: Mar. 6, 2017

(65) Prior Publication Data

US 2017/0336532 A1    Nov. 23, 2017

(30) Foreign Application Priority Data

May 20, 2016 (EP) .................................... 16170621

(51) Int. Cl.
| | | |
|---|---|---|
| *G01W 1/06* | (2006.01) | |
| *F03D 17/00* | (2016.01) | |
| *G01J 1/44* | (2006.01) | |
| *F03D 80/30* | (2016.01) | |
| *G01R 29/08* | (2006.01) | |

(52) U.S. Cl.
CPC ............... *G01W 1/06* (2013.01); *F03D 17/00* (2016.05); *F03D 80/30* (2016.05); *G01J 1/44* (2013.01); *G01R 29/0842* (2013.01); *Y02E 10/72* (2013.01)

(58) Field of Classification Search
CPC .......... G01W 1/06; F03D 17/00; F03D 80/30; G01J 1/44; G01R 29/0842; Y02E 10/72
See application file for complete search history.

(56) References Cited

U.S. PATENT DOCUMENTS

| | | | | |
|---|---|---|---|---|
| 6,552,521 | B1* | 4/2003 | Medelius | ................ G01S 3/808 |
| | | | | 324/72 |
| 7,468,505 | B2 | 12/2008 | Kraemer | |
| 8,073,622 | B2* | 12/2011 | Said | ........................ G01W 1/16 |
| | | | | 702/16 |
| 2011/0265575 | A1* | 11/2011 | Koste | ...................... F03D 80/30 |
| | | | | 73/660 |
| 2012/0133143 | A1* | 5/2012 | Kimura | ................... F03D 80/30 |
| | | | | 290/55 |

(Continued)

FOREIGN PATENT DOCUMENTS

| | | |
|---|---|---|
| EP | 2884099 A1 | 6/2015 |
| JP | 2001020848 A1 | 1/2001 |

OTHER PUBLICATIONS

European Search Report dated Oct. 31, 2016 for Application No. 16170621.3-1607; 6 pgs.

(Continued)

*Primary Examiner* — Daniel S Larkin
*Assistant Examiner* — Anthony W Megna Fuentes
(74) *Attorney, Agent, or Firm* — Schmeiser, Olsen & Watts, LLP

(57) ABSTRACT

A method is provided for locating a lightning strike at a wind turbine including the following steps, detecting a lightning strike, and deriving a location of the lightning strike based on a measurement of sound caused by the lightning strike. Further, a lightning detection system, a wind turbine, a wind farm as well as a computer program product and a computer readable medium are suggested for performing the method.

15 Claims, 3 Drawing Sheets

(56) References Cited

U.S. PATENT DOCUMENTS

2013/0214534 A1* 8/2013 Nakamura .............. F03D 7/00
290/44
2014/0054894 A1 2/2014 Olesen
2014/0278151 A1 9/2014 Newman
2014/0356164 A1 12/2014 Asheim et al.

OTHER PUBLICATIONS

Non-English Chinese Office Action dated Oct. 9, 2018 for Application No. 201710356740.2.

* cited by examiner

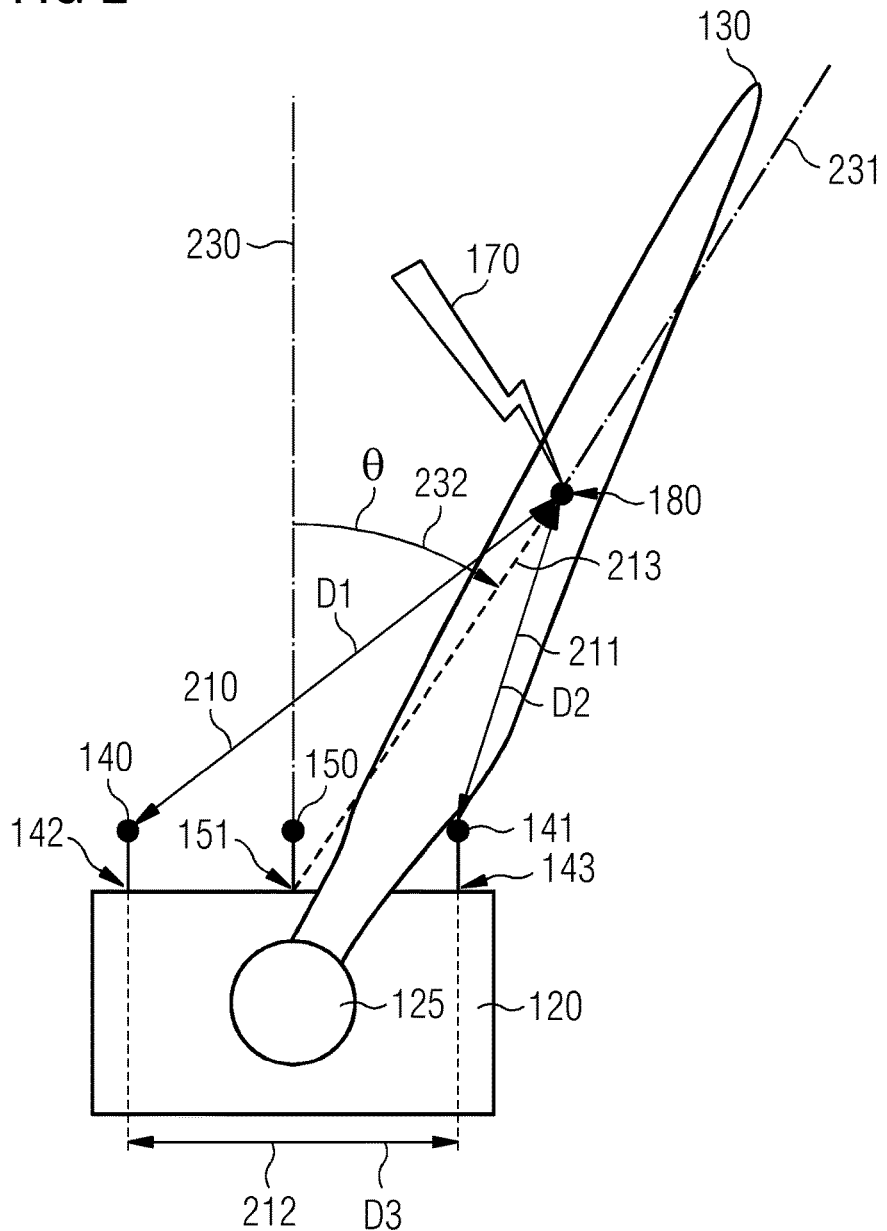

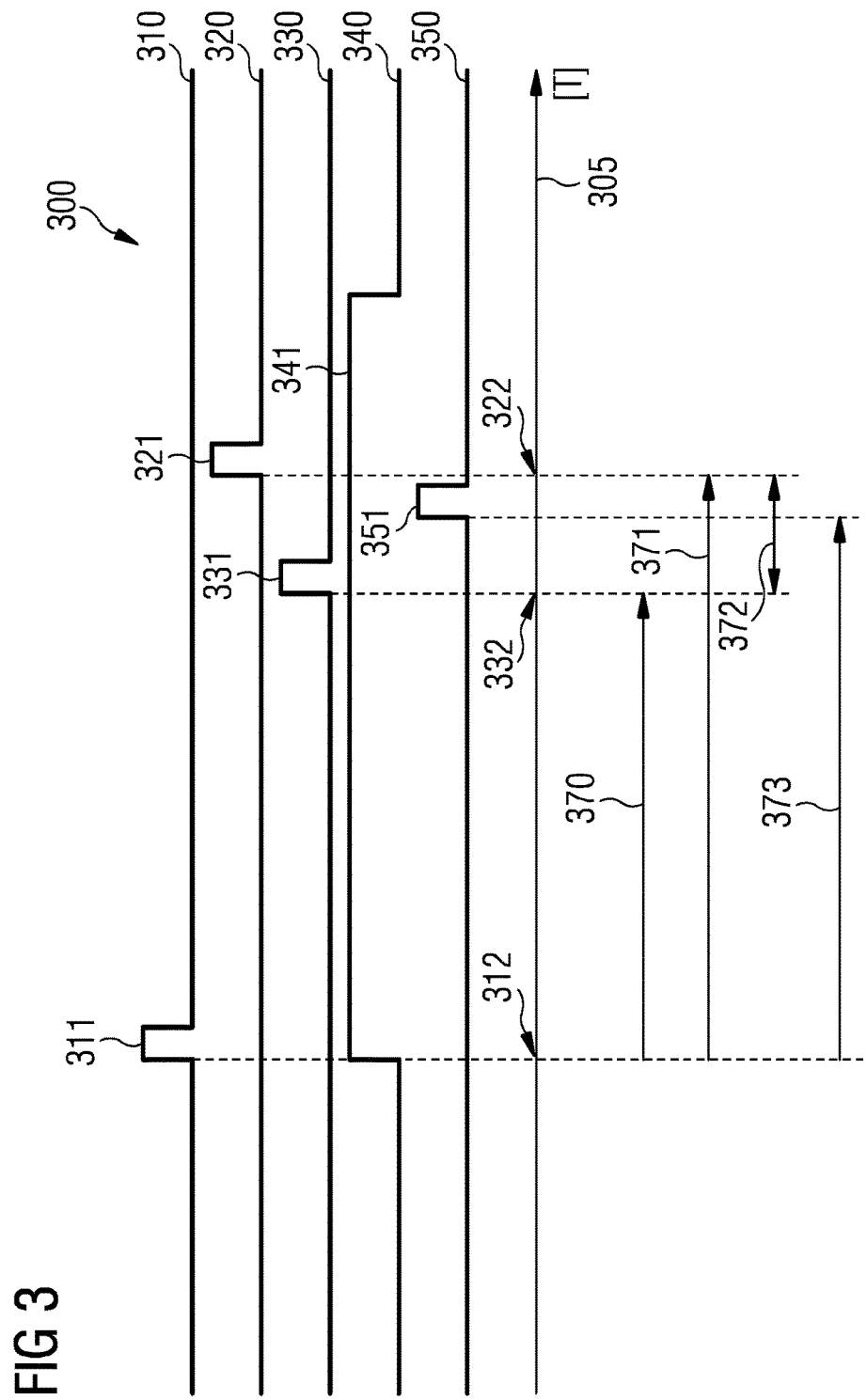

LOCATING A LIGHTNING STRIKE AT A WIND TURBINE

CROSS-REFERENCE TO RELATED APPLICATION

This application claims priority to EP Application No. 16170621.3 having a filing date of May 20, 2016 the entire contents of which are hereby incorporated by reference.

FIELD OF TECHNOLOGY

The following relates to a method, a lightning detection system, a wind turbine and a wind farm. In addition, a computer program product (non-transitory computer readable storage medium having instructions, which when executed by a processor, perform actions) and a computer readable medium are suggested.

BACKGROUND

The increasing height of wind turbines and their location often in open areas make them very exposed to direct lightning strikes. Wind turbines experience significant number of lightning strikes during their lifetime, mostly to the rotor blades. The lightning current can cause severe damage to the blade structural materials and involves considerable costs of repair like, e.g., materials, labor and downtime. Therefore, lightning protection of blades and lightning detection in general in the surrounding of wind turbines is a very important issue.

U.S. Pat. No. 7,468,505B2 relates to a lightning detection system including a conductor configured to receive a lightning strike and transmit a lightning induced current. The system also includes a fiber optic current sensor configured to detect multiple lightning parameters from the lightning induced current. By applying a plurality of fiber optic sensors the system may be configured to measure localization of impact of lightning.

Implementing such plurality of sensors does involve additional hard- and software and in consequence additional costs.

SUMMARY

An aspect relates to an improved approach for a lightning strike detector and locator of a wind turbine.

In order to overcome this problem, a method is provided for locating a lightning strike at a wind turbine comprising the following steps, detecting a lightning strike, deriving a location of the lightning strike based on a measurement of sound caused by the lightning strike.

The phenomena of a lightning or a lightning strike is characterized by a lightning flash followed by acoustic sound (also referred as "thunder"), both being the outcome of an electrical discharge, generating light and sound. Thereby, a time specific delay between the appearance or detection of a lightning flash (characterized by "light") and the appearance of thunder (characterized by "sound") is a well-known phenomenon in physics being the basis of the proposed solution.

In a first step a lightning, i.e. the presence or appearance of a lightning flash indicating a lighting strike is determined and used as a trigger. Several methods or sensors are available for detecting a lightning flash as explained further below.

In a second step, triggered by the detected lightning flash, sound measurements are initiated, e.g., by activating specific sound measurement sensors including time measurements. As an example, sound measurements may comprise the determination of an arrival of sound like thunder at a defined position. Further, a time-information (representing, e.g., a time stamp) is determined representing the time when the sound reaches the defined position. Sound may be represented by a sound wave typically traveling with a speed of sound starting from its origin like, e.g., the position where the detected lightning flash hits or impacts the structure of a wind turbine.

As an example, the arrival of a sound wave at a defined position (together with the time information) may be determined by using a microphone or an accelerometer (sensible for detecting "shock waves") being installed at that position.

Knowing the arrival of a sound wave at a defined or specific position (represented, e.g. by the determined time information) allows a determination of a time duration needed by the sound or sound wave to travel from its origin to the specific position. Based on that an estimation of a distance between the defined position and the origin of the sound is possible.

Using, e.g., a plurality (i.e. two or more) of such defined positions for determining the arrival of sound and thus knowing a plurality of estimated distances between the origin of sound and the defined positions allows a determination of a geographic direction within a defined coordinate system (which is defined by the plurality of positions) and thus enables a localization of the origin of sound, i.e. a determination of the position where the lightning strike hits the structure of the wind turbine. As an example, such a position may be a specific position at a specific rotor blade.

Consequently, one further output of the proposed solution might be that the structure of the wind turbine was not hit by the detected lightning strike. In that situation one further output of the proposed solution would be the determination of the location or position where the lightning strike hits an object beside the wind turbine which might be, e.g., a tree or a building in the neighborhood or another wind turbine close by in a wind park.

As an advantage, by using simple, i.e. non-complex technology, the proposed solution for locating lightning strikes may be implemented for a low amount of money and thus in an economic way.

The means like, e.g., sensors for detecting a lighting or for measuring of sound maybe installed on components of a wind turbine. It should be noted that those means must not necessarily be part of the wind turbine. Alternatively, those means may be also installed aside of the wind turbine like, e.g., at a separate component/element aside the wind turbine or at a further wind turbine in the neighborhood. As an advantage, the necessary means for executing the proposed solution may be shared by a plurality of wind turbines and thus allowing further cost savings.

In an embodiment, the lightning strike is detected based on at least one determined lightning parameter.

In another embodiment, the at least one lightning parameter comprises at least one of brightness, induced magnetic field.

Brightness may be determined by using a light-sensitive sensor being sensitive towards a defined level of brightness. A high level or threshold of brightness might be necessary for a proper detection of a lightning flash.

An induced magnetic field may be determined by an installed pick-up coil.

A positive detection of a lightning flash is used as a trigger for initiating sound measurements, e.g., by activating specific sound and time measurement sensors.

In a further embodiment, the measurement of sound comprises a determination of
- a first time duration the sound needs for arriving at a first defined position, and
- at least one second time duration the sound needs for arriving at least one second defined position.

A time difference corresponding to an inter aural time difference ("ITD") (being explained further below) may be calculated based on the determined first and second time duration.

A further parameter (also referred to as "time of flight") may be derived representing an average duration time based on the first and the at least one second time duration.

Based on the derived results the location of a lightning strike may be determined based on the following relationship:

$$\theta = \sin^{-1}\left(\frac{D_1 - D_2}{D_3}\right)$$

wherein:
D1 represents the distance between the position of the origin of the sound or sound wave and the first defined position,
D2 represents the distance between the position of the origin of the sound or sound wave and the second defined position,
D3 represents the geographic distance between both defined positions.

Rewriting the distances D1 and D2 based on the calculated time difference (also referred as "ITD") will result to $$\theta = \sin^{-1}\left(\frac{V_{sound} * ITD}{D_3}\right)$$

wherein:
$V_{sound}$ represents the speed of sound (~344 m/s)
D3 represents the geographic distance between both defined positions,
ITD represents the calculated time difference.

Based on that relation the azimuth direction angle "θ" can be determined.

Additionally, based on the derived average arrival time ("time of flight") and the respective speed of sound $V_{sound}$ an impact distance may be derived representing a distance towards the estimated position of the lightning strike.

Based on the determined azimuth direction angle "θ" and based on the determined impact distance a proper localization of the lightning strike is possible.

A next embodiment comprises the step of determining a location within a rotor plane of the wind turbine based on the first and the at least one second time duration.

Actual azimuth angles of each of the rotor blades during operation of wind turbine are known by a control unit controlling the operation of the wind turbine. According to an advantageous embodiment, the azimuth direction angle "θ" determined according to the proposed solution and characterizing the position of the lightning strike may be verified with the known actual azimuth angle of each of the rotor blades. Thus, the relevant rotor blade possibly hit by the lightning strike may be easily identified.

It is also an embodiment determining a location within a wind farm comprising a plurality wind turbines based on the first and the at least one second measured time duration.

Pursuant to another embodiment, at least one sound parameter of the respective sound arriving at the first and at the at least one second defined position is determined.

Based on the determined sound parameters further characteristics or parameters of the detected lightning strike may be derived.

According to an embodiment, the at least one sound parameter comprises at least one of
- loudness,
- characteristics of a sound wave arriving at the first and at the at least one second defined position.

According to another embodiment, characteristics of the detected lightning are determined based on the at least one lightning parameter.

In yet another embodiment, the characteristics of the detected lightning strike are determined based on
- an intensity of brightness and/or
- a time duration of brightness.

Based on the determined characteristics of the detected lightning strike an intensity of the detected lightning strike may be derived allowing a possible estimation of the dimension of damage at the wind turbine caused by the lightning strike.

According to another embodiment, an additional sensor for measuring lightning currents may be used for extracting further parameters linked to lightning currents allowing, e.g., an improved estimation of possible damage at the wind turbine like, e.g., an estimation of wear out of replaceable lightning receptors or an estimation of a service interval.

The problem stated above is also solved a lightning detection system, comprising
- at least one sensor for detecting a lightning,
- at least one measuring device for measuring sound caused by the lightning strike,
- a processing unit that is arranged such that the method as described herein is executable thereon.

Said processing unit may comprise at least one of the following: a processor, a microcontroller, a hard-wired circuit, an ASIC, an FPGA, a logic device.

The problem stated above is further solved by a wind turbine comprising at least one lightning detection system as described herein.

The problem stated above is further solved by a wind farm comprising a plurality of wind turbines and at least one lightning detection system as described herein.

The solution provided herein further comprises a a computer program product (non-transitory computer readable storage medium having instructions, which when executed by a processor, perform actions directly loadable into a memory of a digital computer, comprising software code portions for performing the steps of the method as described herein.

In addition, the problem stated above is solved by a computer-readable medium, e.g., storage of any kind, having computer-executable instructions adapted to cause a computer system to perform the method as described herein.

BRIEF DESCRIPTION

Some of the embodiments will be described in detail, with reference to the following figures, wherein like designations denote like members, wherein:

FIG. 2 depicts a more detailed view of the embodiment as shown in FIG. 1; and

FIG. 3 shows, in a diagram, several graphs as variations in time (in relation to a time based x-axis) representing results or outcome of the measurements according to the proposed solution.

DETAILED DESCRIPTION

Figure 1:
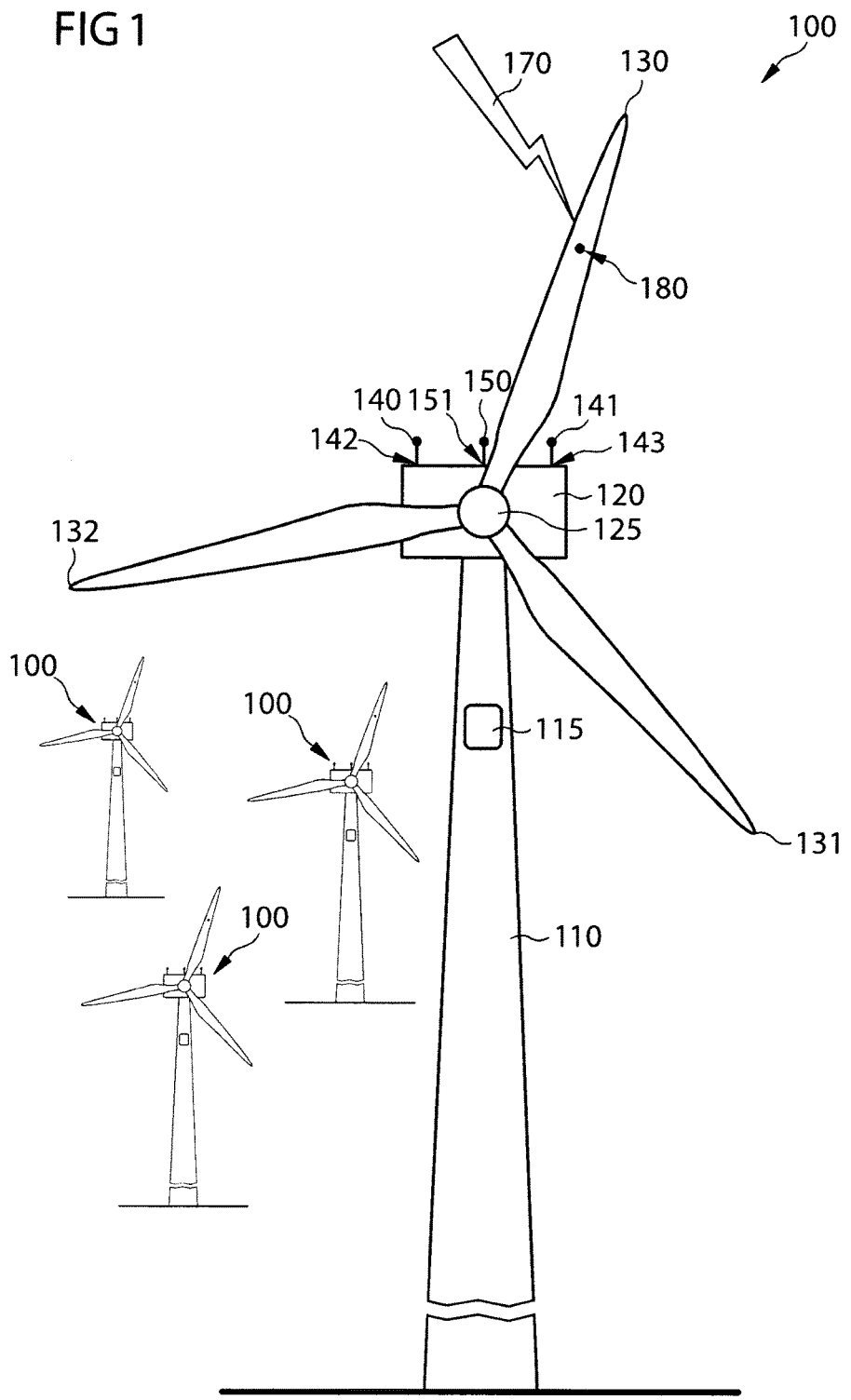
FIG. 1 shows an exemplary embodiment of the proposed solution in relation to an exemplary schematic overview of a wind turbine.

With reference to FIG. 1 an exemplary embodiment of the proposed solution is shown in relation to an exemplary schematic overview of a wind turbine 100. The wind turbine 100 comprises a nacelle 120 rotatable mounted on top of a tower 110 of the wind turbine 100. A rotor hub 125 is rotatable mounted at an upwind side of the nacelle 120. The rotor hub 125 is adapted to be connected to a plurality of rotor blades 130, 131, 132 extending radially from the rotor hub 125 defining a rotor plane.

According to the exemplary embodiment of FIG. 1 a first and second sensor in form of a microphone 140, 141 are mounted at defined positions 142 and 143 on top of the nacelle 120 suitable for measuring sound (also referred to as "sound detector") like the arrival of a sound wave caused by a lightning strike. A further sensor 150 suitable for detecting a lighting flash (also referred to as "flash detector") is installed at a position 151 on the top of the nacelle 150. One possible embodiment of the sensor 150 may be a sensor suitable for measuring brightness, e.g. a light-sensitive sensor.

Each of the detectors 140, 141, 150 is connected via one or more connection lines to an input of a control unit 115 which might be arranged in the nacelle 120 or in the tower 110 of the wind turbine. The control unit 115 comprises a processing unit suitable for processing detected information provided by the detectors 140, 141, 150 according to the proposed solution.

Following the exemplary scenario as depicted in FIG. 1 a lightning strike 170 hits the blade 130 at a specific position indicated by an arrow 180.

By applying the proposed solution as explained in more detail further below a general estimation is possible whether a component of the wind turbine 100 has been hit by the lightning strike 170 or not. In particular the proposed solution allows estimation towards the location or position 180 where the lighting strike hits the wind turbine like, e.g., the rotor blade 130.

FIG. 2 visualizes a more detailed view of the scenario as shown in FIG. 1 (same reference numbers have been assigned to components already shown in FIG. 1). Thereby, both microphones 140, 141 having a local distance D3 indicated by an arrow 212. At the geographic midpoint position 151 between both microphones 140, 141 the light-sensitive sensor 150 is attached on top of the nacelle 120.

A vertical axis 230 having its origin at the position 151 is extracting in longitudinal direction of the tower 110.

A further axis 231 having its origin at the same position 151 is representing a direction towards the position 180 where the lightning strike 170 hits the rotor blade 130.

Both axes 230, 131 show an azimuth direction angle "θ" indicated by an arrow 232.

As already mentioned above, the proposed solution is based on the natural time-based delay between the appearance of a lightning flash and the appearance of a thunder ("Thunder boom") which is sufficient for a suitable estimate of the position 180 where the lightning strike 170 hits the wind turbine.

The use of multiple, spatially distributed microphones 140, 141 as "stereo listening sensors or detectors" allows the localization of sound sources by detecting differences between the sound or sound wave arriving at the microphones 140, 141. It should be noted, that FIG. 2 represents an enlarged symbolic view of an exemplary embodiment of the proposed solution thereby showing microphones 140, 141 and a sensor 150 with big dimensions in relation to the wind turbine. Usually the microphones 140, 141 and sensor 150 are of smaller size being located close to the surface of the nacelle. Thus, there is no or almost no geographic distance between the center of the microphones and the sensor (as indicated by the references 140, 141, 150) and the relevant geographic positions (as indicated by the arrows 142, 143, 151)

The most basic "human" principles used to localize the azimuth of a sound source in a horizontal and/or vertical plane involve an Inter-aural Intensity Difference (IID) and an Inter-aural Time Difference (ITD) between the sound received at each ear. The IID is caused mostly by the shading effect of the head, while the ITD is caused by the difference in distance the sound must travel to reach each ear.

The inventive localization of a lightning strike is based on that principle and will be explained now in more detail with respect to FIG. 2 and FIG. 3.

FIG. 3 shows in a diagram 300 several graphs 310, 320, 330, 340 as variations in time (in relation to a time based x-axis 305) representing results or outcome of the measurements according to the proposed solution. Thereby a graph 310 represents a signal provided by the flash detector 150. Further, a graph 320 represents a signal provided by the first microphone 140 and a graph 330 represents a signal provided by the second microphone 141. The signals 310, 320 and 330 are forwarded to the control unit 115 for further prosecution according to the proposed solution.

When the lightning strike 170 hits the blade 130 at position 180 a lightning flash is detected immediately by the flush detector 150 providing a peak 311 at a time 312. Being triggered by the provided peak 311 the control unit 115 activates a time window 341 as visualized by a graph 340 representing a detection range. Limited by the time frame of that detection range both microphones 140, 141 are actively sensing for arriving acoustic sound waves. A configuration of the time window like, e.g., a definition of the time frame of the detection range may be adapted individually according to wind turbine specific or wind park specific parameters. Such a parameter may be, e.g. the length of installed rotor blades.

As sound is much more slow going than light the sound wave caused by the impact of the lighting strike hitting the blade arrives at the first microphone 140 at a time 322 (first "arrival time") indicated by a peak 321 of the graph 320. Thus, the sound wave needs a time duration indicated by an arrow 371 for traveling along a distance D1 (indicated by an arrow 210) from the position 180 to the position 142 of the first microphone 140.

Further, the sound wave arrives at the second microphone 141 at a time 332 (second "arrival time") indicated by a peak 331 of the graph 330. Thereby the sound wave needs a time duration indicated by an arrow 370 for traveling along a distance D2 (indicated by an arrow 211) from the position 180 to the position 143 of the second microphone 141.

A time difference between the first and second arrival time (which is equal to the inter-aural time difference (ITD)

mentioned above) is calculated by the control unit 115 and indicated by an arrow 372 in FIG. 3.

Further, a "Time of flight" parameter is derived by the control unit 150 representing an average duration time 373 based on both duration times 370, 371

After detection of the arrival of the sound wave at both microphones 140, 141 the time window 340 is deactivated according to graph 340 thereby closing the detection range by deactivating both microphones 140, 141.

Based on the derived results as shown in FIG. 3 the azimuth direction angle "θ" may be determined by the control unit 115 based on the following relationship:

$$\theta = \sin^{-1}\left(\frac{D_1 - D_2}{D_3}\right) \quad (1)$$

wherein:
D1 represents the distance 210 between the position 180 of the origin of the sound wave and the position 142 of the first microphone 140,
D2 represents the distance 211 between the position 180 of the origin of the sound wave and the position 143 of the second microphone 141,
D3 represents the geographic distance 212 between both microphones 140, 141.

Rewriting the distances D1 and D2 based on the calculated time difference 372 (also referred as "ITD") will result to $$\theta = \sin^{-1}\left(\frac{V_{sound} ITD}{D_3}\right) \quad (2)$$

wherein:
$V_{sound}$ represents the speed of sound (~344 m/s)
D3 represents the geographic distance 212 between both microphones 140, 141
ITD represents the calculated time difference 372.

The speed of sound may depend on the current temperature which might be a parameter provided, e.g., by a further sensor as input to be considered in equation (2).

Based on equation (2) the azimuth direction angle "θ" can be determined.

Additionally, based on the derived average arrival time 373 ("time of flight") and the respective speed of sound $V_{sound}$ an impact distance (indicated by an arrow 213) may be derived representing a geographic distance between the origin of the axis 230, 231 (represented by the position 151) and the position 180 of the lightning strike. As indicated in FIG. 2, the impact distance 213 may be the basis for deriving the distance from a root of the rotor blade along the rotor blade toward its tip until the estimated position 180 of the lightning strike 170.

Based on the determined azimuth direction angle "θ" 232 and based on the determined impact distance 213 a proper estimation of the position 180 of the lightning strike 170 is possible.

The inventive localization of a lightning strike may be further improved by using three or more sound detectors at respective defined positions. As an example, by using three detectors a three dimensional localization of a lightning strike is possible. Thereby, by using more than three sound detectors, the precision of the innovative lightning strike localization may be improved.

According to a further embodiment, additional sound detectors may be positioned such, that a specific side of a rotor blade (upwind side or downwind side) may be determined where the lightning strike hits the rotor blade. For that sound detectors may be installed on top of the nacelle and on the rotor hub.

As already mentioned above, small accelerometers may be exemplarily used instead of microphones for detecting an arriving sound wave (i.e. an incoming blast of a thunder stroke).

According to an alternative embodiment, the microphones may be made of fiber optics.

The detection range, allowing a plausibility analysis, represented by the time window 341 may be configured such that a wrong detection of a potential lightning strike can be excluded for an individual wind turbine having a specific hardware like, e.g., rotor blades with a specific length.

Exemplarily assuming a rotor blade with a length of 75 meter ("B75" blade) would result in a maximum "time of flight" 373 of about 0.25 seconds. As a consequence, an arrival time 370, 371 of a sound wave after detection of a lightning flash after 0.25 seconds can be interpreted as a lightning strike ("event") outside the detection range or zone and thus not being relevant for the individual wind turbine—this means the wind turbine has not been hit by the detected lightning strike.

According to a further embodiment, a simple pick-up coil suitable for detecting/determining at least one further lightning parameter like a magnetic field induced by a lightning strike may help to distinguish between a secondary induced phenomena or a real impact of a lightning strike.

According to another embodiment, characteristics of the detected lighting strike may be determined based on further determined lightning parameters like, e.g.,
an intensity of brightness and/or
a time duration of brightness
characterizing the detected lightning.

Based on the determined characteristics of the detected lightning strike an intensity of the detected lightning strike may be derived allowing a possible estimation of the dimension of wear-out of components and a possible damage at the wind turbine caused by the lightning strike.

According to another embodiment, an additional sensor for measuring lightning currents may be used for extracting further parameters linked to lightning currents allowing, e.g., an improved estimation of possible damage at the wind turbine. Based on the extracted parameters a recording (including optional storage) of statistical data regarding lightning induced phenomena on wind turbines might be possible (e.g. timestamp and relevant recorded parameter).

All the information derived according to the proposed solution may be transferred and captured/stored by the control unit of the wind turbine. Alternatively or in addition to that, at least a part of the captured information may be transferred via a SCADA system, e.g. to a central park controller of a wind park for further prosecution.

According to one aspect of the proposed solution discrimination is possible which blade might be hit by a lightning strike. This may be implemented by a lightning detection system or module comprising a sensor to determine which blade is where at a certain point in time. Alternatively, that system or module may be synchronized with the turbine controller knowing the position of the rotor and the blade positions.

Advantageously, the proposed solution may be implemented in an economic way by a low power microprocessor. Further improvements like cost savings are possible by using specific microcontrollers with already implemented on-chip devices like, e.g., oscillators, counters, AD/DA converters temperature sensors or comparators etc.

By implementing a FRAM based microcontroller the energy consumption may be reduced wherein a data retention is guaranteed without the use of batteries.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A method for locating a lightning strike at a wind turbine comprising: detecting a lightning flash of the lightning strike; and deriving a location of the lightning strike at the wind turbine based on a measurement of an arrival time of sound caused by the lightning strike at a plurality of sound measurement sensors; wherein the arrival time is measured from a time corresponding to the detection of the lightning strike to a time that the sound arrives at the sound measurement sensors.

2. The method according to claim 1, wherein the lightning strike is detected based on at least one determined lightning parameter.

3. The method according to claim 2, wherein the at least one lightning parameter comprises at least one of a brightness, and an induced magnetic field.

4. The method according to claim 2, further comprising: determining characteristics of the detected lightning strike based on the at least one lightning parameter.

5. The method according to claim 4, wherein the characteristics of the detected lightning strike are determined based on an intensity of brightness and/or a time duration of brightness.

6. The method according to claim 1, wherein the measurement of the arrival time of the sound comprises a determination of: a first time duration the sound needs for arriving at a first defined position, and at least one second time duration the needs for arriving at an at least one second defined position.

7. The method according to claim 6, further comprising: determining a location within a rotor plane of the wind turbine based on the first time duration and the at least one second time duration.

8. The method according to claim 6, further comprising: determining a location of the lightning strike within a wind farm comprising a plurality wind turbines based on the first time duration and the at least one second time duration.

9. The method according to claim 6, further comprising: determining at least one sound parameter of the respective sound arriving at the first defined position and at the at least one second defined position.

10. The method according to claim 9, wherein the at least one sound parameter comprises at least one of: a loudness and a plurality of characteristics of a sound wave arriving at the first defined position and at the at least one second defined position.

11. A lightning detection system comprising: at least one sensor for detecting a lightning strike; a plurality of sound measurement sensors for measuring sound caused by the lightning strike; and a processing unit that is arranged such that the method according to claim 1 is executable thereon.

12. A wind turbine, comprising:
at least one lightning detection system according to claim 11.

13. A wind farm, comprising:
a plurality of wind turbines, and
at least one lightning detection system according to claim 11.

14. A computer program product, comprising a non-transitory computer readable hardware storage device having a non-transitory computer readable program code stored therein, said program code executable by a processor of a computer system to implement a method according to claim 1.

15. A non-transitory computer readable medium, having non-transitory computer-executable instructions adapted to cause a computer system to perform the steps of the method according to claim 1.

* * * * *